(12) United States Patent
Lim

(10) Patent No.: US 12,150,285 B2
(45) Date of Patent: Nov. 19, 2024

(54) INVERTER APPARATUS OF A MOBILITY WITH STACKED COOLERS

(71) Applicants: Hyundai Motor Company, Seoul (KR); Kia Corporation, Seoul (KR)

(72) Inventor: Ji Hwan Lim, Uiwang-Si (KR)

(73) Assignees: Hyundai Motor Company, Seoul (KR); Kia Corporation, Seoul (KR)

(*) Notice: Subject to any disclaimer, the term of this patent is extended or adjusted under 35 U.S.C. 154(b) by 249 days.

(21) Appl. No.: 17/738,552

(22) Filed: May 6, 2022

(65) Prior Publication Data

US 2023/0055412 A1   Feb. 23, 2023

(30) Foreign Application Priority Data

Aug. 18, 2021  (KR) .................. 10-2021-0109044

(51) Int. Cl.
*H05K 7/20* (2006.01)
*H02M 7/00* (2006.01)

(52) U.S. Cl.
CPC ............ *H05K 7/209* (2013.01); *H02M 7/003* (2013.01); *H05K 7/20436* (2013.01); *H05K 7/20927* (2013.01)

(58) Field of Classification Search
CPC ........... H05K 7/20218; H05K 7/20254; H05K 7/2029; H05K 7/2039; H05K 7/20409; H05K 7/20436; H05K 7/20509; H05K 7/20845; H05K 7/20872; H05K 7/20881; H05K 7/2089; H05K 7/209; H05K 7/20927; H05K 7/20936; H05K 2201/06; H05K 2201/064; H05K 7/20445; H05K 7/20454; H02M 7/00; H02M 7/003; B60K 11/00; B60K 11/02; H01G 2/08; H01H 9/52; H01L 23/34; H01L 23/46; H01L 23/473

See application file for complete search history.

(56) References Cited

U.S. PATENT DOCUMENTS

| | | | |
|---|---|---|---|
| 10,070,565 B2* | 9/2018 | Mizuno | ............... H05K 7/20927 |
| 2013/0003301 A1* | 1/2013 | Miyamoto | ......... H05K 7/20927 |
| | | | 361/699 |
| 2014/0160822 A1* | 6/2014 | Kuwano | ................. B60L 50/40 |
| | | | 363/141 |

(Continued)

FOREIGN PATENT DOCUMENTS

| | | |
|---|---|---|
| JP | 2010104204 A * | 5/2010 |
| JP | 2012-227472 A | 11/2012 |

(Continued)

OTHER PUBLICATIONS

Machine translation completed Mar. 1, 2024, KR 2019/0081330A by Cho (Year: 2024).*

(Continued)

*Primary Examiner* — Zachary Pape
*Assistant Examiner* — Steven Ngo
(74) *Attorney, Agent, or Firm* — Morgan, Lewis & Bockius LLP

(57) ABSTRACT

An inverter apparatus of a mobility has a structure in which a power module and a cooler are stacked so that an overall size of the inverter apparatus is reduced, and the cooler is pressed by a cover so that the cooler and the power module are in contact with each other, increasing the cooling performance of the cooler.

12 Claims, 4 Drawing Sheets

(56) References Cited

U.S. PATENT DOCUMENTS

| | | | | |
|---|---|---|---|---|
| 2014/0284765 A1* | 9/2014 | Kiuchi | .................. | H02M 7/537 |
| | | | | 257/532 |
| 2015/0189790 A1* | 7/2015 | Tachibana | .......... | H05K 7/20927 |
| | | | | 361/699 |
| 2016/0106011 A1 | 4/2016 | Mizuno | | |
| 2017/0365890 A1* | 12/2017 | Lim | .................. | H01M 8/04029 |
| 2018/0098457 A1* | 4/2018 | Takeuchi | ............ | H05K 7/20927 |
| 2019/0254182 A1* | 8/2019 | Nakatsu | ............... | H05K 5/0026 |

FOREIGN PATENT DOCUMENTS

| | | | | | |
|---|---|---|---|---|---|
| KR | 20-1999-0007511 U | | 2/1999 | | |
| KR | 10-2016-0109200 A | | 9/2016 | | |
| KR | 2019081330 A | * | 7/2019 | ............. | H02K 11/33 |
| WO | WO-2014034331 A1 | * | 3/2014 | ............ | H02M 7/003 |

OTHER PUBLICATIONS

Machine translation completed Mar. 1, 2024, JP 2010/104204A by Tonomoto (Year: 2024).*

Machine translation completed Mar. 1, 2024, WO 2014/034331 by Matsuo (Year: 2024).*

* cited by examiner

INVERTER APPARATUS OF A MOBILITY WITH STACKED COOLERS

CROSS REFERENCE TO RELATED APPLICATION

The present application claims priority to Korean Patent Application No. 10-2021-0109044, filed Aug. 18, 2021, the entire contents of which is incorporated herein for all purposes by this reference.

BACKGROUND OF THE PRESENT DISCLOSURE

Field of the Present Disclosure

The present disclosure relates to an inverter apparatus of a mobility, the inverter apparatus having a structure in which a power module and a cooler are stacked so that an overall size of the inverter apparatus is reduced, and the cooler is pressed by a cover so that the cooler and the power module are in contact with each other, increasing the cooling performance of the cooler.

Description of Related Art

An environmentally friendly vehicle, such as a hybrid vehicle or an electric vehicle, which utilizes an electric motor as a drive source, generally utilizes a high-voltage battery as an energy source for driving the electric motor. Furthermore, as a power conversion component, the environmentally friendly vehicle utilizes an inverter that provides power supply to the electric motor and utilizes a low DC-DC converter (LDC) that generates 12V power for a vehicle.

Here, between the electric motor and the high-voltage battery, the inverter converts a DC power supply of the high-voltage battery into a three phase AC power supply, and provides the three phase AC power supply to the electric motor.

A main objective of a conventional electric vehicle is to drive in a short-distance and to drive in a city, so that an electric vehicle having a relatively predetermined output model of about 100 kW has been used to be a mainstream conventional electric vehicle. That is, because the electric vehicle does not need a predetermined output, a single motor which is a power source of the electric vehicle was generally used at front wheels, and thus the inverter that supplies current to the motor was also provided to correspond to an output within a relatively small range.

However, various electric vehicles such as a sports-car-type electric vehicle, a SUV-type electric vehicle, and the like have recently been developed, so that output specifications required for the electric vehicles have diversified. Due to limitations on a size and a weight of the motor, when only the single motor is used, it is impossible to satisfy the number of output specifications which is increased, so that an electric vehicle model in which a plurality of motors is provided on front wheels and rear wheels is being developed. Therefore, specifications of the inverter that supplies current to the motor also have diversified. For example, when a 200 kW motor is provided on the front wheels and a 300 kW motor is provided on the rear wheels, there is a problem that the same inverter has difficulty in handling the two motors at the same time.

Meanwhile, in the inverter provided in a plane, a power module, a capacitor, and an LDC are disposed on a bottom surface of a housing, and a control board is provided to be positioned at a top end portion of the housing. However, conventionally, the inverter had a structure in which the power module, the capacitor, and the LDC are simply stacked inside the housing, so that there has been a problem that an overall size of the inverter is increased.

Furthermore, a cooling flow path through which a cooling water flows has been formed below the power module in which an excessive heat occurs and the LDC, so that performance deterioration and damage of an element caused by excessive heat is prevented. However, conventionally, a performance of transferring heat between the cooling flow path and the power module was not secured, so that there is a problem that cooling of the power module is not smoothly performed.

To solve this, a separate structure was applied so that the cooling flow path and the power module are in close contact with each other. However, because a metal material was used in the separate structure to secure hardness, there was a problem that an overall weight and a size were increased.

The information included in this Background of the present disclosure section is only for enhancement of understanding of the general background of the present disclosure and may not be taken as an acknowledgement or any form of suggestion that this information forms the prior art already known to a person skilled in the art.

BRIEF SUMMARY

Various aspects of the present disclosure are directed to providing an inverter apparatus of a mobility, the inverter apparatus including a structure in which a power module and a cooler are stacked so that an overall size of the inverter apparatus is reduced, and the cooler is pressed by a cover so that the cooler and the power module are in contact with each other, increasing the cooling performance of the cooler.

In various aspects of the present disclosure, there is provided an inverter apparatus of a mobility, the inverter apparatus including: a housing provided with an internal space therein; a power module provided in the internal space of the housing; a cooler provided to be in contact with the power module and configured to cool the power module by a heat transfer with the power module; and a cover mounted on the housing and configured to shield the internal space, the cover being configured to press the cooler by being in contact with the cooler when the cover is mounted on the housing, bringing the cooler into close contact with the power module.

The cooler may include a plurality of coolers which is an upper end cooler and a lower end cooler, and the power module may be located between the upper end cooler and the lower end cooler.

The inverter apparatus may further include: a control board electrically connected to the power module in the internal space of the housing, wherein the control board may be disposed lateral to the power module or the cooler in the internal space.

When a plurality of power modules is provided, a plurality of coolers may be provided to correspond to the power modules, respectively, and the power modules and the coolers may be disposed to be spaced out along a border of the control board.

The housing may be divided into an upper space and a lower space separated by a partition wall that crosses the internal space, and the power module and the cooler may be provided in the upper space and a bus bar module and a capacitor that are electrically connected to the power module may be provided in the lower space.

When a plurality of bus bar modules is provided, the bus bar modules may be disposed to be spaced out along a border of the capacitor.

The housing may be configured so that an upper portion and a lower portion thereof are opened, so that the upper space may be opened upward and the lower space may be opened downward.

When the cover is in a state of being mounted on the housing, a portion of the cover matching the cooler may protrude downward, forming a recessed portion which is in contact with the cooler.

The recessed portion may be formed by the cover being recessed downward, and the recessed portion may be formed to be divided into a plurality of recessed portions in a longitudinal direction of the cooler.

The inverter apparatus of the mobility configured as described above has the structure in which the power module and the cooler are stacked so that an overall size of the inverter apparatus is reduced, and the cooler is pressed by the cover so that the cooler and the power module are in contact with each other, so that the cooling performance of the cooler is increased.

The methods and apparatuses of the present disclosure have other features and advantages which will be apparent from or are set forth in more detail in the accompanying drawings, which are incorporated herein, and the following Detailed Description, which together serve to explain certain principles of the present disclosure.

Figure 1:
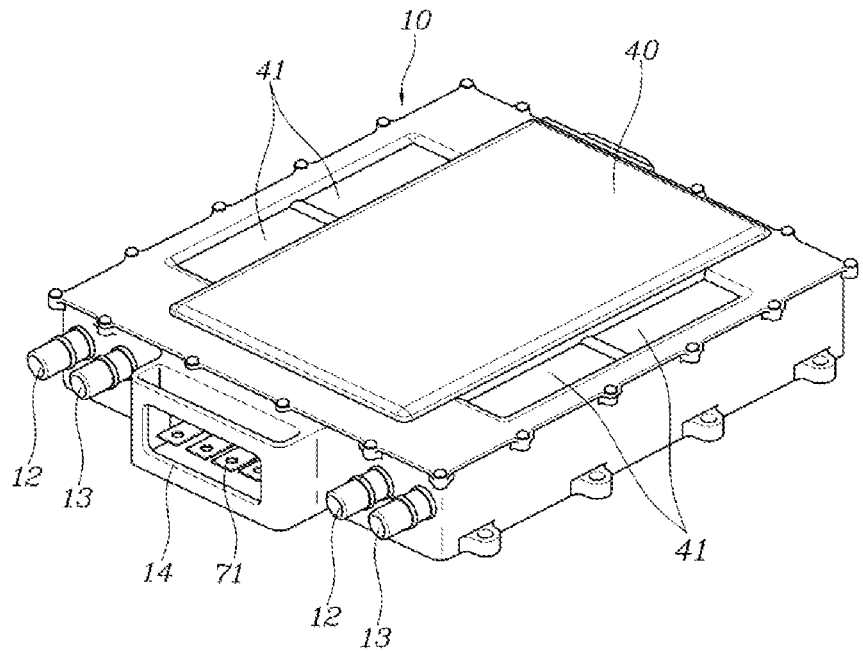
FIG. 1 is a view exemplarily illustrating an inverter apparatus of a mobility according to an exemplary embodiment of the present disclosure.

It may be understood that the appended drawings are not necessarily to scale, presenting a somewhat simplified representation of various features illustrative of the basic principles of the present disclosure. The specific design features of the present disclosure as included herein, including, for example, specific dimensions, orientations, locations, and shapes will be determined in part by the particularly intended application and use environment.

In the figures, reference numbers refer to the same or equivalent parts of the present disclosure throughout the several figures of the drawing.

DETAILED DESCRIPTION

Reference will now be made in detail to various embodiments of the present disclosure(s), examples of which are illustrated in the accompanying drawings and described below. While the present disclosure(s) will be described in conjunction with exemplary embodiments of the present disclosure, it will be understood that the present description is not intended to limit the present disclosure(s) to those exemplary embodiments of the present disclosure. On the other hand, the present disclosure(s) is/are intended to cover not only the exemplary embodiments of the present disclosure, but also various alternatives, modifications, equivalents and other embodiments, which may be included within the spirit and scope of the present disclosure as defined by the appended claims.

Hereinafter, an inverter apparatus of a mobility according to various exemplary embodiments of the present disclosure will be described with reference to accompanying drawings.

Figure 2:
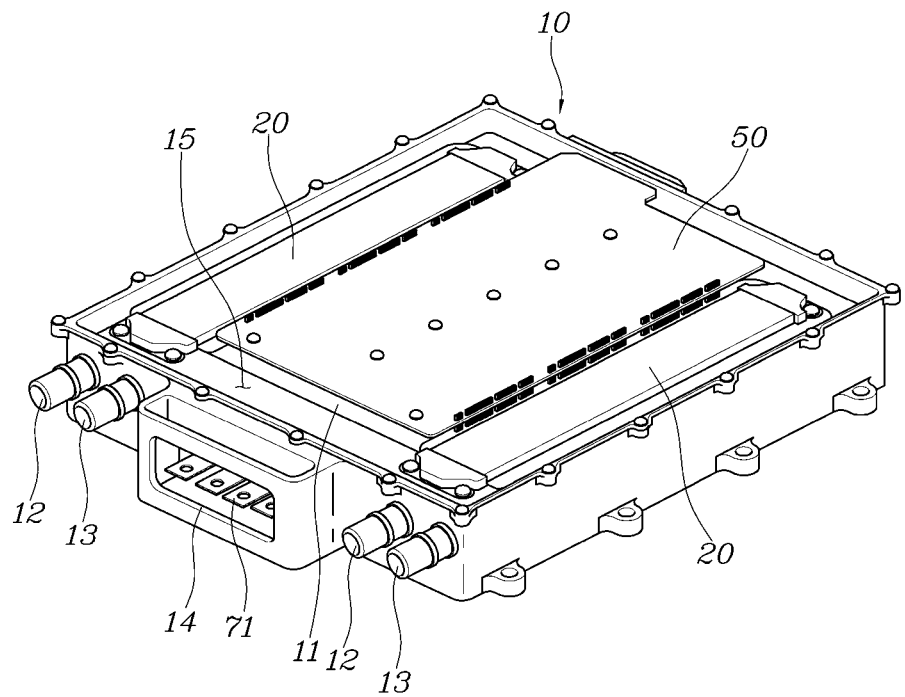
FIG. 2 is a view exemplarily illustrating an internal portion of a housing of the inverter apparatus of the mobility according to an exemplary embodiment of the present disclosure.
Figure 3:
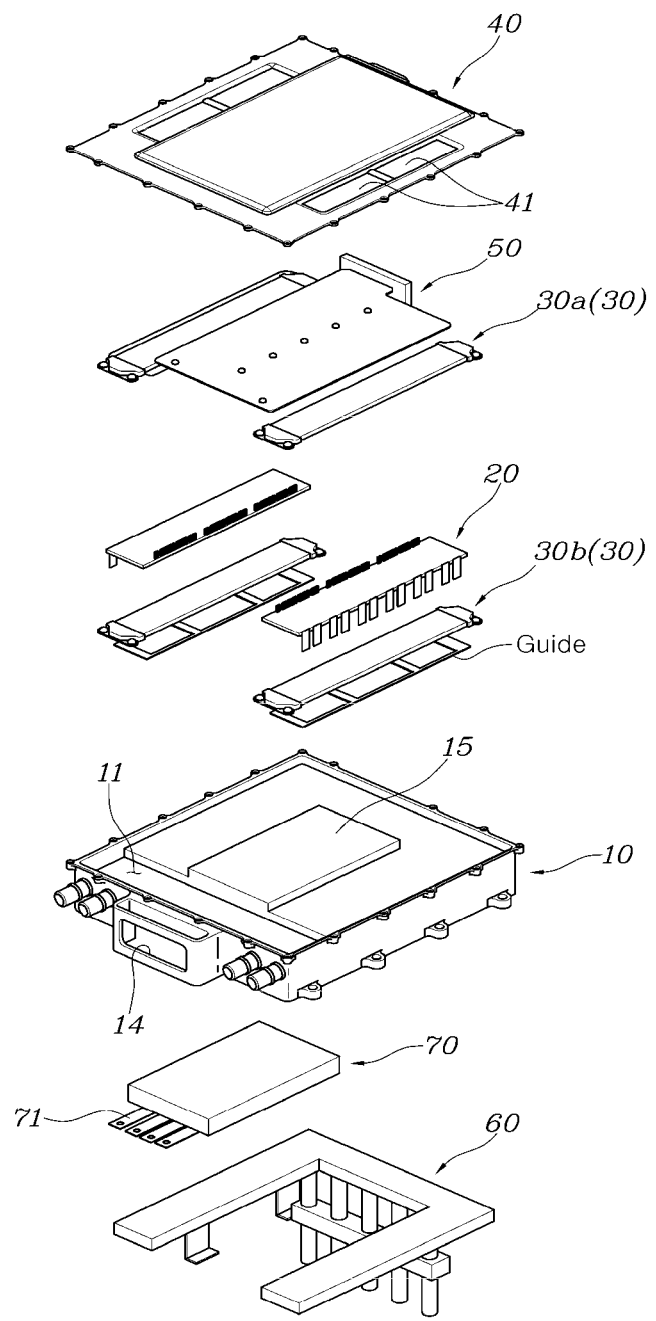
FIG. 3 is an assembly view exemplarily illustrating the inverter apparatus of the mobility according to an exemplary embodiment of the present disclosure.
Figure 4:
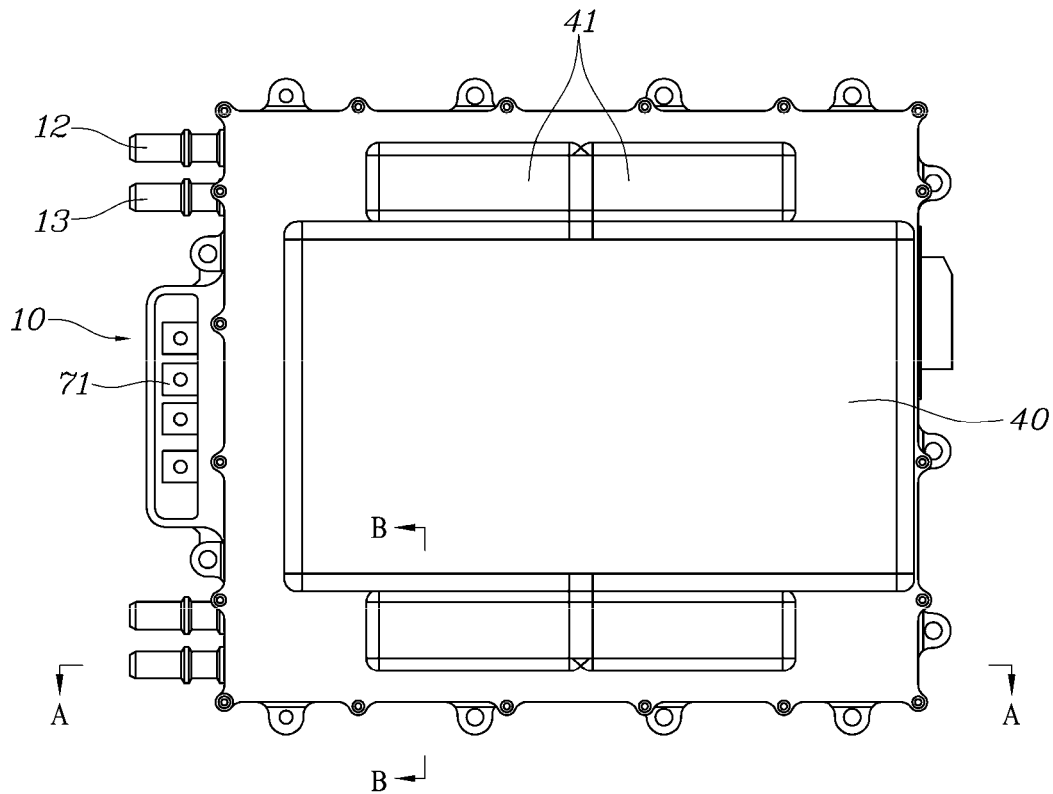
FIG. 4 is a plan view exemplarily illustrating the inverter apparatus of the mobility according to an exemplary embodiment of the present disclosure.
Figure 5:
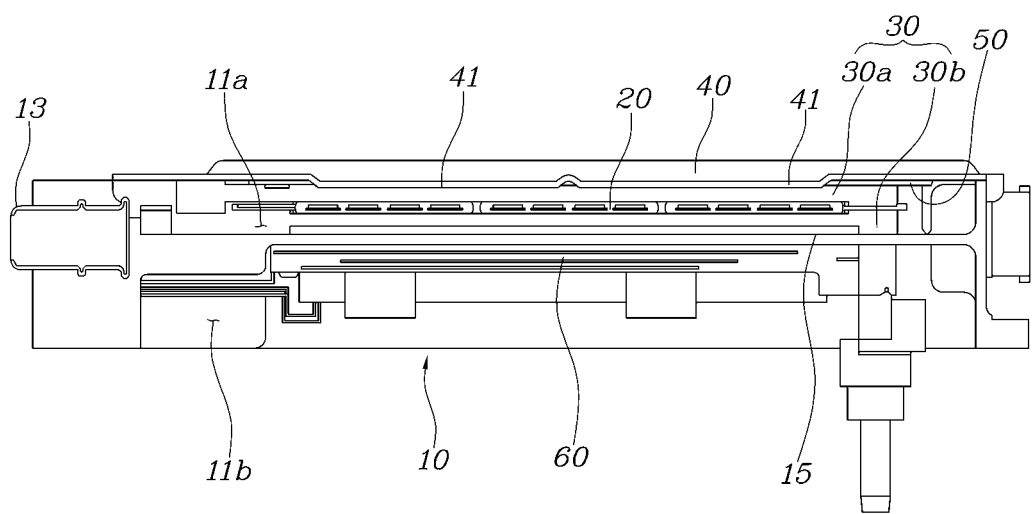
FIG. 5 is a cross-sectional view taken along line A-A in FIG. 4.
Figure 6:
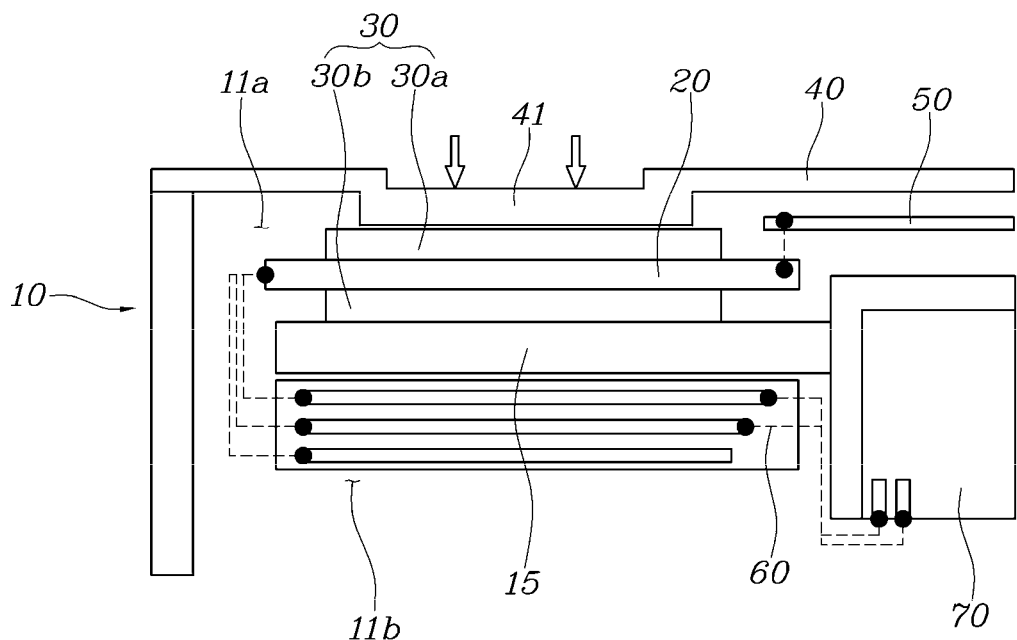
FIG. 6 is a cross-sectional view taken along line B-B in FIG. 4.

FIG. 1 is a view exemplarily illustrating an inverter apparatus of a mobility according to an exemplary embodiment of the present disclosure. FIG. 2 is a view exemplarily illustrating an internal portion of a housing of the inverter apparatus of the mobility according to an exemplary embodiment of the present disclosure. FIG. 3 is an assembly view exemplarily illustrating the inverter apparatus of the mobility according to an exemplary embodiment of the present disclosure. FIG. 4 is a plan view exemplarily illustrating the inverter apparatus of the mobility according to an exemplary embodiment of the present disclosure. FIG. 5 is a cross-sectional view taken along line A-A in FIG. 4. FIG. 6 is a cross-sectional view taken along line B-B in FIG. 4.

As illustrated in FIGS. 1 to 6, the inverter apparatus of the mobility includes: a housing 10 provided with an internal space 11; a power module 20 provided in the internal space 11 of the housing 10; a cooler 30 provided to be in contact with the power module 20 and configured to cool the power module 20 by a heat transfer with the power module 20; and a cover 40 mounted on the housing 10 and configured to shield the internal space 11, the cover 40 being configured to press the cooler 30 by being in contact with the cooler 30 when the cover 40 is mounted on the housing 10, bringing the cooler 30 into close contact with the power module 20.

Here, the internal space 11 in which various electrical components that form the inverter including the power module 20 and the cooler 30 are provided is formed in the housing 10. The housing 10 is formed so that either an upper portion or a lower portion thereof is opened or both the upper portion and the lower portion thereof are opened, so that the various electrical components including the power module 20 and the cooler 30 may be mounted in the internal space 11.

Accordingly, because the cover 40 is mounted on the housing 10 and the cover 40 shields the internal space 11, a foreign substance is blocked from being introduced into the internal space 11 of the housing 10, and internal components are protected from external shock.

Furthermore, at the housing 10, an inlet port 12 and an outlet port 13 into which a cooling medium is introduced and discharged are formed, and a terminal insertion portion 14 where a terminal 71 of a capacitor that will be described later is exposed may be formed.

The power module 20 and the cooler 30 are provided in the internal space 11 of the housing 10. The power module 20 is configured to convert direct current (DC) into three-phase alternating current (AC), and high-temperature heat is generated due to operating characteristics of the power module 20. Accordingly, the cooler 30 for cooling the power module 20 is provided in the housing 10 and is disposed to be in contact with the power module 20, and the cooling medium undergoes heat transfer with the power module 20 so that the power module 20 is cooled.

The cover 40 is mounted on the housing 10 and shields the internal space 11, and is configured to press the cooler 30 by being in contact with the cooler 30 when the cover 40 is mounted on the housing 10, so that the cooler 30 is in close contact with the power module 20.

Accordingly, because the cooler 30 and the power module 20 are in contact with each other, a heat transferring performance is secured, so that a performance of cooling the power module 20 is increased. Furthermore, as a vibration transferred from outside to the housing 10 is transferred to the cooler 30 through the cover 40, the cooling medium circulating through the cooler 30 absorbs the vibration, so that a problem of a resonance frequency of the cover 40 is solved. Furthermore, when the vibration transferred through the cover 40 is transferred to the cooler 30, a vortex is generated in the cooling medium inside the cooler 30, so that a greater cooling performance may be further secured.

The aforementioned present disclosure is described now in detail. The cooler 30 includes a plurality of components which is an upper end cooler 30a and a lower end cooler 30b, and the power module 20 is located between the upper end cooler 30a and the lower end cooler 30b.

That is, when high-temperature heat is generated on the power module 20, the high-temperature heat is radiated to an overall portion of the power module 20. Accordingly, the cooler 30 includes the upper end cooler 30a which is disposed at an upper side of the power module 20 and the lower end cooler 30b which is disposed at a lower side of the power module 20. Furthermore, because the power module 20 is located between the upper end cooler 30a and the lower end cooler 30b, the power module 20 undergoes heat transfer with each of the upper end cooler 30a and the lower end cooler 30b, so that the cooling may be efficiently performed.

These upper end cooler 30a and the lower end cooler 30b extend in a longitudinal direction of the power module 20, allowing the overall portion of the power module 20 to be cooled. That is, the power module 20 and each of the upper end cooler 30a and the lower end cooler 30b are formed so that contact areas between each other are secured as much as possible, so that the performance of cooling the power module 20 may be increased.

Meanwhile, in the internal space 11, a control board 50 which is electrically connected to the power module 20 is further provided. Furthermore, in the internal space 11, the control board 50 is disposed lateral to the power module 20 or the cooler 30.

Accordingly, in a configuration that forms the inverter, the control board 50 for controlling the power module 20 is provided. In the internal space 11 of the housing 10, because the control board 50 is disposed lateral to the power module 20 or the cooler 30, a vertical height of the housing 10 in accordance with the provision of the control board 50 is reduced.

At the present time, the control board 50 may be disposed lateral to the cooler 30 to avoid damage caused by heat when heat is generated on the power module 20. The control board 50 is disposed lateral to the cooler 30 and is spaced apart in a vertical direction from the cooler 30, so that influences of both the power module 20 and the cooler 30 are minimized.

Meanwhile, when a plurality of power modules 20 is provided, a plurality of coolers 30 is provided to correspond to the power modules 20, respectively, and the power modules 20 and the coolers 30 may be disposed to be spaced out along a border of the control board 50.

That is, when a plurality of inverters is provided since a required output of the mobility is increased, the plurality of coolers 30 is provided to correspond to the power modules 20, respectively. Accordingly, because the power modules 20 are cooled by the coolers 30, respectively, the performance of cooling the power module 20 by the cooler 30 may be secured even when the plurality of power modules 20 is provided.

Because the plurality of power modules 20 and the plurality of coolers 30 are disposed to be spaced out along the border of the control board 50, the vertical height of the housing 10 in accordance with the provision of the control board 50 is reduced. That is, because the height of the housing 10 is increased when the power module 20, the cooler 30, and the control board 50 are configured in a stacked structure, the power module 20 and the cooler 30 are disposed lateral to the control board 50, so that the height of the housing 10 is reduced, and thus the inverter of the present disclosure is configured for being easily applied to the mobility.

Meanwhile, as illustrated in FIG. 6, the housing 10 includes an upper space 11a and a lower space 11b by a partition wall 15 that crosses the internal space 11. Furthermore, the power module 20 and the cooler 30 are provided in the upper space 11a, and a bus bar module 60 and a capacitor 70 that are electrically connected to the power module 20 are provided in the lower space 11b.

Here, in the capacitor 70, three pairs of P and N terminals are provided, and each of the P and N terminals is connected to the power module 20 via the bus bar module 60.

Accordingly, in the housing 10, the internal space 11 includes the upper space 11a and the lower space 11b by the partition wall 15. Here, the power module 20, the cooler 30, and the control board 50 are provided in the upper space 11a, and the bus bar module 60 and the capacitor 70 that are electrically connected to the power module 20 are provided in the lower space 11b.

Accordingly, the power module 20, the cooler 30, and the control board 50 are mounted at the upper space 11a via the housing 10 and the partition wall 15, and at the lower space 11b, the bus bar module 60 and the capacitor 70 are mounted at the housing 10 and the partition wall 15, so that packaging of each configuration is facilitated and interference between the configurations is minimized.

The bus bar module 60 and the capacitor 70 are separated from the internal space 11 of the housing 10 by the partition wall 15, so that influence of electromagnetic waves is reduced.

Meanwhile, when a plurality of bus bar modules 60 is provided, the bus bar modules 60 are disposed to be spaced out along a border of the capacitor 70. In the present manner, because the plurality of bus bar modules 60 is disposed along the border of the capacitor 70, the vertical height of the housing 10 in accordance with the provision of the bus bar module 60 and the capacitor 70 that are provided inside the housing 10 is reduced. That is, because the height of the housing 10 is increased when the bus bar module 60 and the capacitor 70 are configured in a stacked structure, the bus bar module 60 is disposed lateral to the capacitor 70, so that the height of the housing 10 is reduced.

Meanwhile, the housing 10 is formed so that the upper and lower portions thereof are opened, so that the upper space 11a is opened upward and the lower space 11b is opened downward.

Accordingly, parts of electrical components such as the power module 20, the cooler 30, and the control board 50 may be mounted at the internal space 11 by being inserted into the opened upper portion of the housing 10, and parts of electrical components such as the bus bar module 60 and the capacitor 70 may be mounted at the internal space 11 by being inserted into the opened lower portion of the housing 10.

Here, the cover 40 is mounted on the upper portion of the housing 10 and shields the upper space 11a, and a separate cover 40 may be mounted on the lower portion of the housing 10 and may shield the lower space 11b.

Meanwhile, when the cover 40 is in a state of being mounted on the housing 10, a portion matching to the cooler 30 protrudes downward, so that a recessed portion 41 which is in contact with the cooler 30 is formed.

Accordingly, because the recessed portion 41 that protrudes downward is formed at an internal side surface of the cover 40, the recessed portion 41 is in contact with the cooler 30 and presses the cooler 30 when the cover 40 is mounted on the housing 10, so that the cooler 30 is in close contact with the power module 20.

Here, the recessed portion 41 is formed by the cover 40 being recessed downward, and the recessed portion 41 may be formed to be divided into a plurality of recessed portions 41 in a longitudinal direction of the cooler 30.

Accordingly, because the recessed portion 41 is matched to the cooler 30 when the cover 40 is mounted on the housing 10, the cooler 30 pressed by the recessed portion 41 and the power module 20 are in close contact with each other, so that the performance of transferring heat between the cooler 30 and the power module 20 is secured.

Furthermore, as a contact area between the recessed portion 41 of the cover 40 and the cooler 30 is increased, the vibration generated from the cover 40 is transferred to the cooler 30, and the vibration is absorbed by the cooling medium of the cooler 30.

Furthermore, when the vibration is transferred to the cooler 30 from the cover 40 through the recessed portion 41, the vortex is generated in the cooling medium which is circulating through the cooler 30, so that the cooling performance may be secured.

In the inverter apparatus of the mobility configured as described above, the inverter apparatus has the structure in which the power module 20 and the cooler 30 are stacked so that an overall size of the inverter apparatus is reduced, and the cooler 30 is pressed by the cover 40 so that the cooling performance of the cooler 30 is increased.

For convenience in explanation and accurate definition in the appended claims, the terms "upper", "lower", "inner", "outer", "up", "down", "upwards", "downwards", "front", "rear", "back", "inside", "outside", "inwardly", "outwardly", "interior", "exterior", "internal", "external", "forwards", and "backwards" are used to describe features of the exemplary embodiments with reference to the positions of such features as displayed in the figures. It will be further understood that the term "connect" or its derivatives refer both to direct and indirect connection.

The foregoing descriptions of specific exemplary embodiments of the present disclosure have been presented for purposes of illustration and description. They are not intended to be exhaustive or to limit the present disclosure to the precise forms disclosed, and obviously many modifications and variations are possible in light of the above teachings. The exemplary embodiments were chosen and described to explain certain principles of the present disclosure and their practical application, to enable others skilled in the art to make and utilize various exemplary embodiments of the present disclosure, as well as various alternatives and modifications thereof. It is intended that the scope of the present disclosure be defined by the Claims appended hereto and their equivalents.

What is claimed is:

1. An inverter apparatus of a mobility, the inverter apparatus including:
   a housing provided with an internal space therein;
   a power module provided in the internal space of the housing;
   a cooler provided to be in contact with the power module and configured to cool the power module by a heat transfer with the power module; and
   a cover mounted on the housing and configured to shield the internal space, the cover being configured to press the cooler by being in contact with the cooler when the cover is mounted on the housing, bringing the cooler into contact with the power module,
   wherein the cooler includes a plurality of coolers which is an upper end cooler and a lower end cooler, and
   wherein the housing includes an upper space and a lower space separated by a partition wall that crosses the internal space, and the lower end cooler provided in the upper space is in direct contact to the partition wall.

2. The inverter apparatus of claim 1, wherein the power module is located between the upper end cooler and the lower end cooler.

3. The inverter apparatus of claim 1, wherein the upper end cooler and the lower end cooler extend in a longitudinal direction of the power module, allowing an overall portion of the power module to be cooled.

4. The inverter apparatus of claim 1, further including:
   a control board electrically connected to the power module in the internal space of the housing,
   wherein the control board is disposed lateral to the power module or the cooler in the internal space.

5. The inverter apparatus of claim 4, wherein the control board is spaced apart in a vertical direction from the cooler.

6. The inverter apparatus of claim 4, wherein when a plurality of power modules is provided, a plurality of coolers is provided to correspond to the power modules, respectively, and the power modules and the coolers are disposed to be spaced out along a border of the control board.

7. The inverter apparatus of claim 1, wherein the housing includes an upper space and a lower space separated by a partition wall that crosses the internal space, and the power module and the cooler are provided in the upper space and a bus bar module and a capacitor that are electrically connected to the power module are provided in the lower space.

8. The inverter apparatus of claim 7, wherein the capacitor is mounted at the partition wall.

9. The inverter apparatus of claim 7, wherein when a plurality of bus bar modules is provided, the bus bar modules are disposed to be spaced out along a border of the capacitor.

10. The inverter apparatus of claim 7, wherein the housing is configured so that an upper portion and a lower portion thereof are opened, and the upper space is opened upward and the lower space is opened downward.

11. The inverter apparatus of claim 1, wherein, when the cover is in a state of being mounted on the housing, a portion of the cover matching the cooler protrudes downward, forming a recessed portion which is in contact with the cooler.

12. The inverter apparatus of claim 11, wherein the recessed portion is formed by the cover being recessed downward, and the recessed portion is formed to be divided into a plurality of recessed portions in a longitudinal direction of the cooler.

* * * * *